United States Patent
Oh et al.

(10) Patent No.: US 6,828,616 B2
(45) Date of Patent: Dec. 7, 2004

(54) INTEGRATED CIRCUIT DEVICES THAT UTILIZE DOPED POLY-SI$_{1-x}$GE$_x$ CONDUCTIVE PLUGS AS INTERCONNECTS

(75) Inventors: Sang-jeong Oh, Seoul (KR); Yeong-kwan Kim, Kyungki-do (KR); Seung-hwan Lee, Seoul (KR); Dong-chan Kim, Seoul (KR); Young-wook Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 22 days.

(21) Appl. No.: 10/012,116

(22) Filed: Nov. 13, 2001

(65) Prior Publication Data

US 2002/0093042 A1 Jul. 18, 2002

(30) Foreign Application Priority Data

Jan. 15, 2001 (KR) .......................... 2001-2171

(51) Int. Cl.$^7$ .................... H01L 27/108; H01L 29/76
(52) U.S. Cl. ................... 257/303; 257/306; 257/309
(58) Field of Search ................. 257/296, 300, 257/303, 306, 307, 309; 438/238, 239, 250, 253, 255

(56) References Cited

U.S. PATENT DOCUMENTS

| | | | |
|---|---|---|---|
| 5,563,448 A | 10/1996 | Lee et al. ................. | 257/742 |
| 5,909,059 A | * 6/1999 | Hada et al. ............... | 257/750 |
| 6,030,874 A | 2/2000 | Grider et al. ............. | 438/301 |
| 6,075,291 A | 6/2000 | Thakur ..................... | 257/751 |

FOREIGN PATENT DOCUMENTS

| | | |
|---|---|---|
| JP | 4-42575 | 2/1992 |
| JP | 4-42968 | 2/1992 |
| JP | 4-225568 | 8/1992 |
| JP | 8-139032 | 5/1996 |
| KR | 1999-0063050 | 7/1999 |
| KR | 2000-0017583 | 3/2000 |

OTHER PUBLICATIONS

King et al., *Electrical Properties of Heavily Doped Polycrystalline Silicon–Germanium Film*, Ieee Transactions on Electron Devices, vol. 41, No. 2, Feb. 1994, pp. 228–232.
Notice to Submit Response, KR Application No. 10–2001–0002171, Oct. 31, 2002, 2 pages.

* cited by examiner

*Primary Examiner*—Hung Vu
(74) *Attorney, Agent, or Firm*—Myers Bigel Sibley & Sajovec, P.A.

(57) ABSTRACT

The present invention provides an integrated circuit device that include a semiconductor substrate having a semiconductor region of first conductivity type therein extending adjacent the surface of the substrate. The device further includes an electrically insulating layer with a contact hole in it that exposes the semiconductor region of first conductivity type on the surface of the semiconductor substrate. The device still further includes a poly-Si$_{1-x}$Ge$_x$ conductive plug of first conductivity type that extends in the contact hole and is electrically connected to the semiconductor region of first conductivity type is provided.

5 Claims, 9 Drawing Sheets

INTEGRATED CIRCUIT DEVICES THAT UTILIZE DOPED POLY-$Si_{1-x}Ge_x$ CONDUCTIVE PLUGS AS INTERCONNECTS

RELATED APPLICATION

This application is related to Korean Application No. 2001-2171, filed Jan. 15, 2001, the disclosure of which is hereby incorporated herein by reference.

FIELD OF THE INVENTION

The present invention relates to semiconductor devices and methods of fabricating the same and, more particularly, to semiconductor devices that use doped conductive plugs as interconnects and methods of fabricating the same.

BACKGROUND OF THE INVENTION

As semiconductor devices continue to decrease in size, the elements that make up these devices, such as channel lengths, intervals between active areas, via holes, metal studs, contact sizes, and the widths of metal interconnection also decrease. Due to the miniaturization of semiconductor devices including capacitors, such as a dynamic random access memory (DRAM), methods for forming self aligned contacts (SACs) are being used due to lack of a misalignment margin in a photolithography process. For example, a buried contact pad and a direct contact pad may be formed between word lines of a DRAM using a method for forming a SAC, and a buried contact plug may be formed between bit lines of a DRAM using the same method for forming a SAC. Thus, the lower electrode of the capacitor may be formed so that it is in contact with the buried contact plug and connected to the impurity region within the active area through the buried contact pad and the buried contact plug.

Typically, the direct contact pad, the buried contact pad, and the buried contact plug are formed using a doped polycrystalline silicon layer. Doped polycrystalline silicon layers have superior filling ability and stability in the presence of heat which makes them a desirable material for the elements of a semiconductor device. Furthermore, the doped polycrystalline silicon layer has an advantage over other materials in that a contact resistance of the semiconductor device may be reduced due to activation of a dopant by a high temperature annealing process. However, the high temperature annealing process may have negative effects on other elements of the device.

For example, a buried contact pad and a direct contact pad that are in direct contact with an $n^+$ type impurity region of a semiconductor substrate may be provided. If the buried contact pad is formed using a doped polycrystalline silicon layer and the annealing process is used to activate the dopant, impurities of the doped polycrystalline silicon layer may be diffused within the semiconductor substrate, thus possibly causing the electrical characteristics of a transistor to deteriorate.

By way of further example, a $p^+$ type impurity region within the semiconductor device that is not in direct contact with metal interconnection on the semiconductor substrate may be provided in order to overcome an increased height difference between the impurity region and the metal interconnection. Instead, after a metal stud connected to the $p^+$ type impurity region is formed, the metal stud is in contact with the metal interconnection instead of the p+ type impurity region. The metal stud may be formed during a middle step when the bit lines of the cell area are formed.

In this case, a titanium silicide (Ti-silicide) layer is typically formed on the lower portion or the upper portion of the metal stud as a barrier metal layer for an ohmic contact. A high temperature annealing process may be accompanied by a step of forming the buried contact plug using the doped polycrystalline silicon layer, a step of activating the polycrystalline silicon layer dopant, and a step of forming a dielectric layer forming the capacitor, which are performed after the metal stud is formed. Impurities of the p+ type impurity region, for example, boron, may be diffused into the Ti-silicide layer by this high temperature annealing process such that a titanium-boron compound is formed which may result in an increased contact resistance.

SUMMARY OF THE INVENTION

Embodiments of the present invention provide an integrated circuit device that include a semiconductor substrate having a semiconductor region of first conductivity type extending adjacent the surface of the substrate. The device further includes an electrically insulating layer with a contact hole therein that exposes the semiconductor region of first conductivity type on the surface of the semiconductor substrate. The device still further includes a poly-$Si_{1-x}Ge_x$ conductive plug of first conductivity type that extends in the contact hole and is electrically connected to the semiconductor region of first conductivity type.

Further aspects of embodiments of the present invention include a germanium mole fraction x that is in a range between about 0.1 and about 0.5. Additional embodiments of the present invention include a germanium mole fraction x that is less than about 0.35 but greater than 0.1. In further embodiments of the present invention the germanium mole fraction x within the poly-$Si_{1-x}Ge_x$ conductive is greater than about 0.25 and less than 0.35. In some embodiments of the present invention the poly-$Si_{1-x}Ge_x$ conductive plug may be doped with impurities, for example, phosphorus (P), arsenic (As) and antimony (Sb).

In further embodiments of the present invention an integrated circuit memory device is provided that includes a semiconductor substrate. A memory cell access transistor adjacent the surface of the semiconductor substrate includes a word line on the surface and source and drain regions of first conductivity type in the semiconductor substrate. A first interlayer insulating layer is provided on the semiconductor substrate and has a first opening therein that extends opposite the source region. A first poly-$Si_{1-x}Ge_x$ conductive plug of first conductivity type extends in the first opening and is electrically connected to the source region. An integrated circuit capacitor extends on the semiconductor substrate and has an electrode electrically connected to the first poly-$Si_{1-x}Ge_x$ conductive plug.

In still further embodiments of the present invention the integrated circuit memory device may include a second interlayer insulating layer on the first interlayer insulating layer that has a second opening therein that extends opposite the first poly-$Si_{1-x}Ge_x$ conductive plug. A second poly-$Si_{1-x}Ge_x$ conductive plug of first conductivity type extends in the second opening and is electrically connected to the poly-$Si_{1-x}Ge_x$ conductive plug. The germanium mole fraction x within the second poly-$Si_{1-x}Ge_x$ conductive plug may be unequal to the germanium mole fraction x within the first poly-$Si_{1-x}Ge_x$ conductive plug.

Further embodiments of the integrated circuit may further include an integrated circuit capacitor that extends on the second interlayer insulating layer and has a lower electrode electrically connected to the second poly-$Si_{1-x}Ge_x$ conductive plug. The lower electrode may directly contact the second poly-$Si_{1-x}Ge_x$ conductive plug.

Some additional embodiments of the present invention provide an integrated circuit device that includes a semiconductor substrate and an electrically insulating layer on the semiconductor substrate. The electrically insulating layer has a contact hole in it and a poly-$Si_{1-x}Ge_x$ conductive plug of first conductivity type that extends into the contact hole is further included.

While the present invention is described above primarily with reference to devices, methods of fabricating the devices is also provided.

BRIEF DESCRIPTION OF THE DRAWINGS

FIGS. 5A through 7A are cross-sectional views cut in the bit line direction illustrating methods of fabricating semiconductor devices having doped polycrystalline silicon-germanium layers according to embodiments of the present invention;

FIGS. 5B through 7B are cross-sectional views cut in the gate line direction illustrating a methods of fabricating semiconductor devices having doped polycrystalline silicon-germanium layers according to embodiments of the present invention;

DETAILED DESCRIPTION OF THE INVENTION

Figure 1:
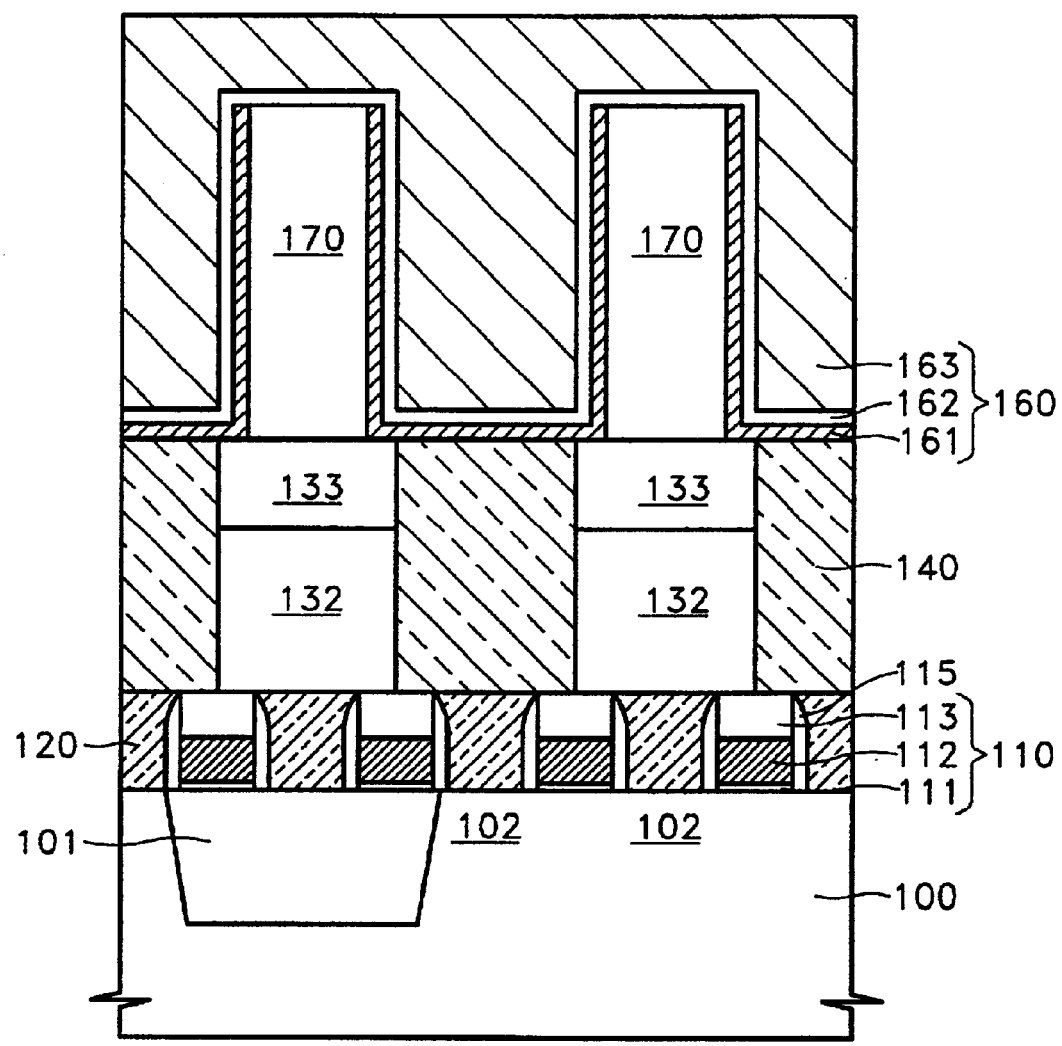
FIG. 1 is a cross-sectional view cut in a bit line direction illustrating semiconductor devices having doped polycrystalline silicon-germanium layers according to embodiments of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like reference numerals refer to like elements throughout.

Embodiments of the present invention will now be described in detail below with reference to FIGS. 1 through 9, which illustrate various embodiments of the present invention and various processes of fabricating embodiments of the present invention. A semiconductor device is provided having a doped polycrystalline silicon-germanium layer. As described in detail below, a contact pad that contacts the impurity regions of the semiconductor substrate and a buried contact plug connecting the contact pad to the lower electrodes of the capacitor are both formed using the polycrystalline silicon-germanium layer doped with n-type impurities, thus allowing the activation of the dopant to be performed at a lower temperature relative to conventional devices. The present invention may also prevent property deterioration of the semiconductor device, such as increased resistance in parts of the device that are susceptible to heat.

Figure 2:
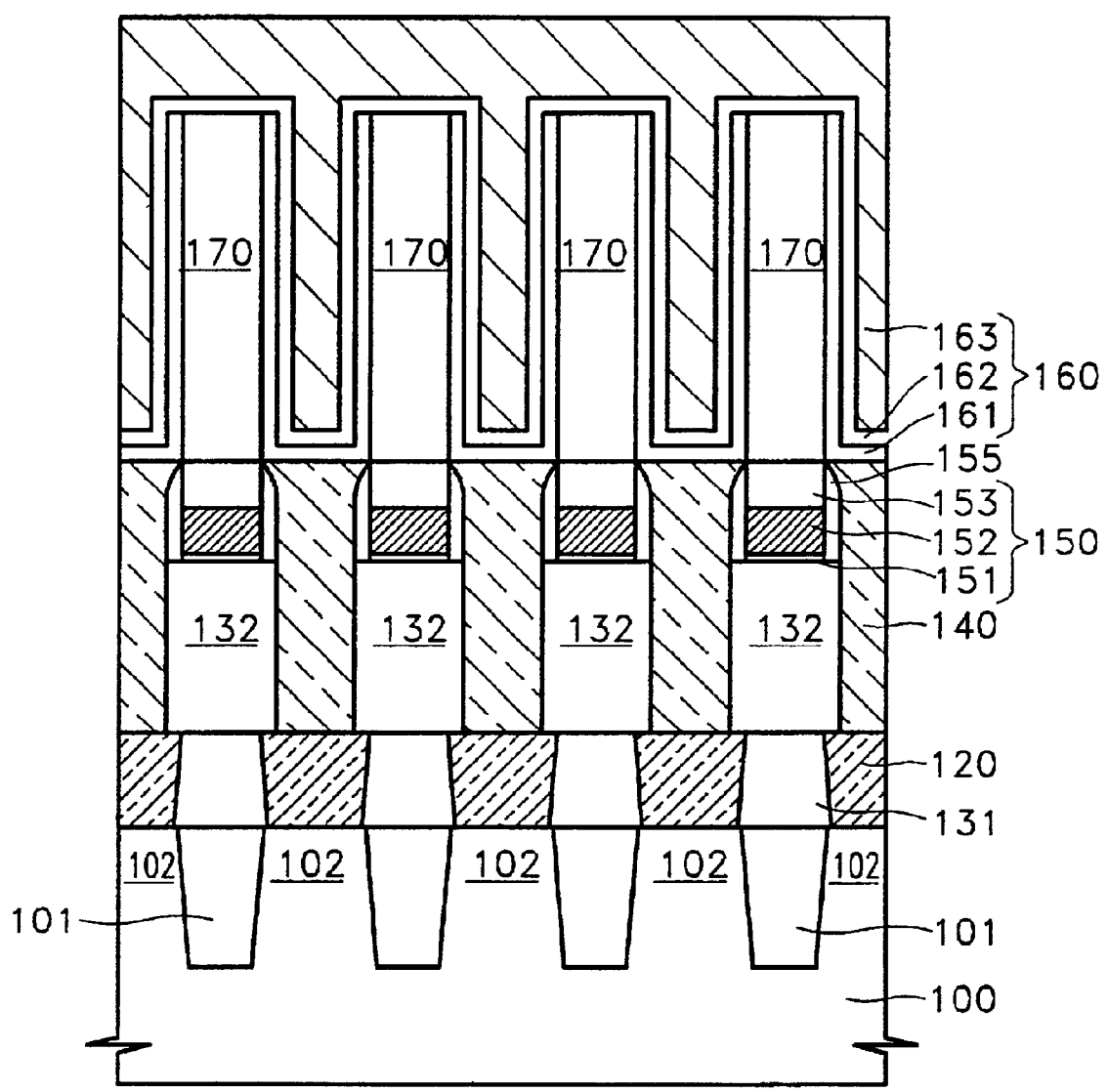
FIG. 2 is a cross-sectional view cut in a gate line direction illustrating semiconductor devices having doped polycrystalline silicon-germanium layers according to embodiments of the present invention.

FIG. 1 is a cross-sectional view cut in a bit line direction illustrating semiconductor devices having doped polycrystalline silicon-germanium layers according to embodiments of the present invention. FIG. 2 is a cross-sectional view cut in a gate line direction illustrating semiconductor devices having doped polycrystalline silicon-germanium layers according to embodiments of the present invention. Thus, the bit line is not shown in FIG. 1 and the gate line is not shown in FIG. 2.

Now referring to FIGS. 1 and 2, semiconductor devices according to embodiments of the present invention will now be described in detail. As seen in FIG. 1, a semiconductor substrate 100 is provided. An active area 102 is defined within the semiconductor substrate 100 by an isolation area 101. The isolation area 101 is illustrated in FIGS. 1 and 2 as a recess, but as will be understood by those having skill in the art, it may also be made using a local oxidation of silicon (LOCOS) method. In the active area 102, there are impurity regions of predetermined conductivity types corresponding to a source and a drain region of a transistor (not shown). The transistor may be a p-channel or an n-channel transistor. If the transistor is a p-channel transistor, the impurity regions have a high concentration of p-type impurities. If, on the other hand, the transistor is an n-channel transistor, the impurity regions have a high concentration of n-type impurities. N-channel transistors are typically used in the cell area of dynamic random access memory (DRAM).

A plurality of gate lines 110 are provided on the surface of the semiconductor substrate 100 separated from each other. Each of the gate lines 110 are in a stack structure in which a gate capping layer 113 is on a gate conductive layer 112, which is on a gate insulating layer 111. A optional metal silicide layer (not shown) can be further disposed between the gate conductive layer 112 and the gate capping layer 113 for reducing resistance. Gate spacers 115 are provided on the sidewalls of the gate lines 110.

As further illustrated in FIGS. 1 and 2, a conductive contact pad 120 and a first electrically insulating layer 131 are provided in the space between the gate spacers 115. The contact pad 120 may be a buried contact pad or a direct contact pad. The buried contact pad is used for connecting the impurity regions of the semiconductor substrate 100 to a lower electrode of a capacitor. A direct contact pad is used for connecting the impurity regions of the semiconductor substrate 100 to a bit line.

The contact pad 120 includes a polycrystalline silicon-germanium layer doped with impurities of a predetermined conductivity type. The conductivity type of the doped impurities is typically the same as that of the impurity regions of the semiconductor substrate 100. For example, the contact pad 120 connected to the impurity regions of the n-channel transistor may be formed using the polycrystalline silicon-germanium layer doped with the n-type impurities. The n-type impurities may be phosphorous (P), arsenic (As) or antimony (Sb). Polycrystalline silicon-germanium has a lower melting point than silicon, thus, deposition, crystallization, growth of grains, and activation of impurities are typically performed at relatively low temperatures.

Now referring to FIG. 3, a graph illustrating dopant activation with respect to a germanium mole fraction of doped polycrystalline silicon-germanium layers according to embodiments of the present invention will be discussed. The doped polycrystalline silicon-germanium layer measured in FIG. 3, of which the dopant is phosphorous (P), is annealed at a temperature of about 900° C. for about 40 minutes and has a thickness of about 0.3 μm. The injection concentration of the dopant is about $4 \times 10^{15}$ cm$^2$, and the injection energy of the dopant is about 60 KeV.

Figure 3:
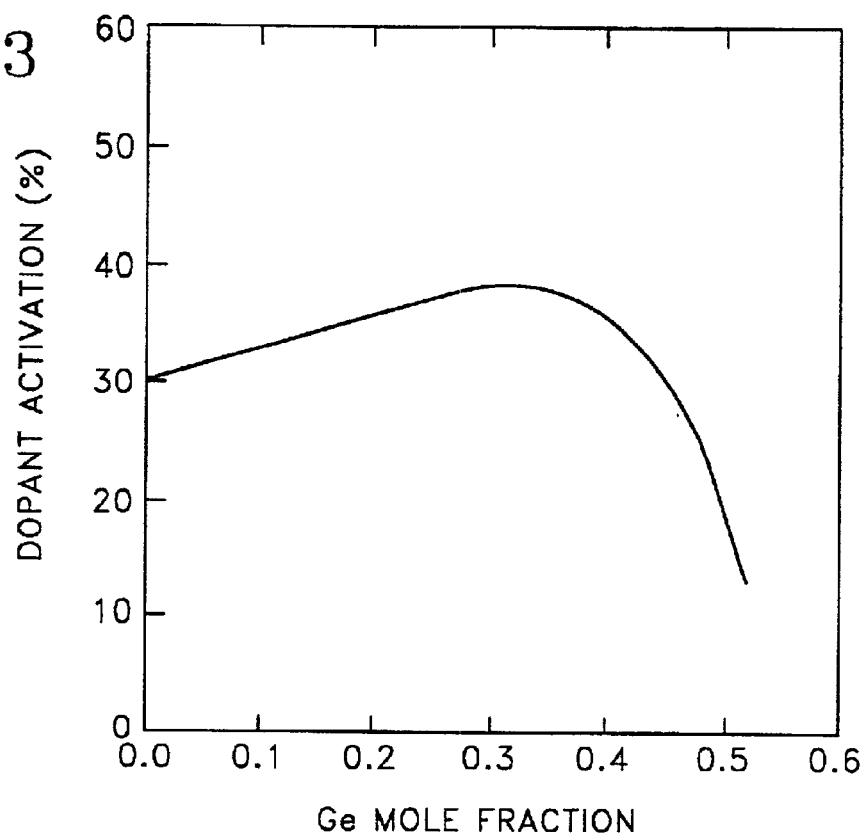
FIG. 3 is a graph illustrating dopant activation with respect to a germanium mole fraction of a doped polycrystalline silicon-germanium layer according to embodiments of the present invention.

As shown in FIG. 3, if the germanium mole fraction is less than 0.5, dopant activation of the doped polycrystalline silicon-germanium layer is enhanced about 12–40% compared with the conventional doped polycrystalline silicon layer. When the germanium mole fraction is about 0.35, the dopant activation typically reaches a maximum value of 40%. Therefore, the dopant can be sufficiently activated at a relatively low temperature by controlling the germanium mole fraction.

Figure 4:
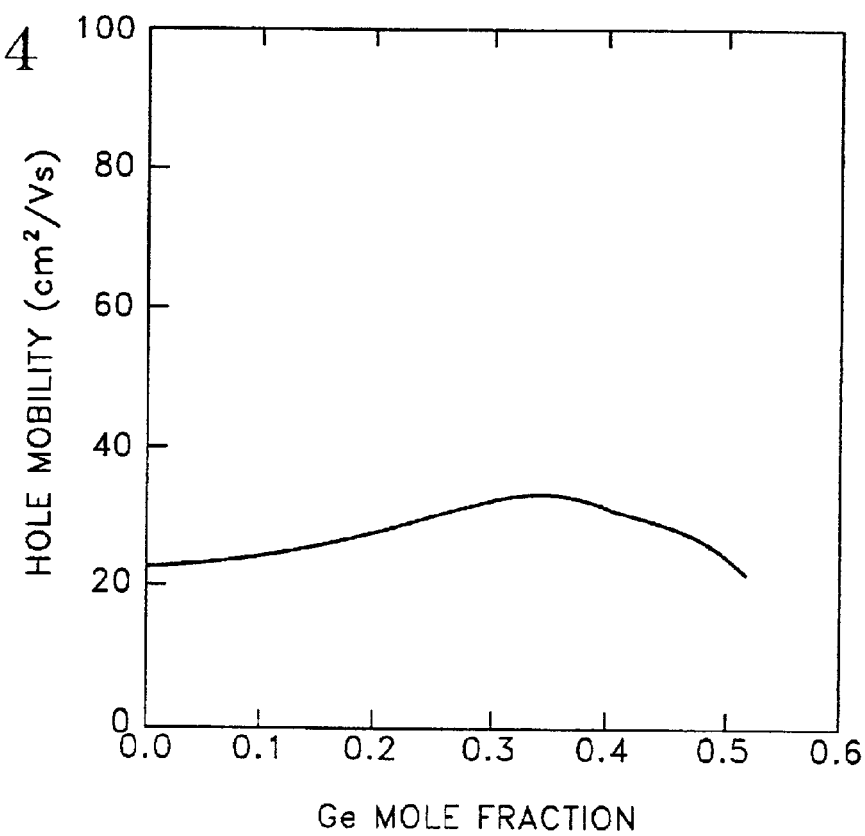
FIG. 4 is a graph illustrating hole electron mobility with respect to a germanium mole fraction of a doped polycrystalline silicon-germanium layer according to embodiments of the present invention.

Referring to FIG. 4, a graph illustrating the hole electron mobility with respect to a germanium mole fraction of doped polycrystalline silicon-germanium layers according to embodiments of the present invention will now be discussed in detail. The doped polycrystalline silicon-germanium layer measured in FIG. 4, of which the dopant is phosphorous (P), is annealed at a temperature about 900° C. for about 40 minutes and has a thickness of about 0.3 μm. The injection concentration of the dopant is about $4 \times 10^{15}$ cm$^2$, and the injection energy of the dopant is about 60 KeV.

As shown in FIG. 4, if the germanium mole fraction is less than 0.5, the hole electron mobility of the doped polycrystalline silicon-germanium layer measured by the hall measurement is about 20 cm$^2$/V$_s$. Preferably, when the germanium mole fraction is about 0.35, the hole electron mobility reaches the maximum value, 37 cm$^2$/V$_s$.

Referring again to FIGS. 1 and 2, a second electrically insulating layer 132 is provided on the contact pad 120 and the first electrically insulating layer 131. A plurality of bit lines 150 are provided on the second electrically insulating layer 132 separated from each other. Each of the bit lines 150 is formed so that its lengthwise direction crosses that of the gate lines 110. The bit lines 150 is formed as a stack structure in which a bit line conductive layer 152 is on a barrier metal layer 151 and the bit line conductive layer 152 is on a bit line capping layer 153. An optional metal silicide layer (not shown) may be further provided between the bit line conductive layer 152 and the bit line capping layer 153 for reducing resistance. A plurality of bit line spacers 155 are provided on the sidewalls of the bit lines 150.

A buried contact plug 140 is formed on the buried contact pad, which is the contact pad 120 connected to the lower electrode of the capacitor through a third electrically insulating layer 133 and the second electrically insulating layer 132 between the bit line spacers 155. In other words, a buried contact plug 140 adjacent to another buried contact plug 140 is electrically separated by the second electrically insulating layer 132, the third electrically insulating layer 133, and the bit line spacers 155. The buried contact plug 140 includes a conductive material, preferably a doped polycrystalline silicon-germanium layer. The conductivity type of the doped impurities is typically the same as that of the majority carrier within the impurity regions of the semiconductor substrate 100. For example, in the case of the buried contact plug 140 connected to the impurity regions of the n-channel transistor, a polycrystalline silicon-germanium layer doped with the n-type impurities is used. The n-type impurities may be phosphorous (P), arsenic (As), or antimony (Sb). As described above, the polycrystalline silicon-germanium has a lower melting point than silicon, so deposition, crystallization, growth of grains, and activation of impurities are typically performed at a relatively low temperature.

Lower electrodes 161 of a capacitor 160 are provided on the buried contact plug 140. The lower electrodes 161 of the capacitor 160 are separated by an insulating layer 170. A barrier metal layer (not shown) may optionally be provided between the buried contact plug 140 and the lower electrode 161. The lower electrode 161 of the capacitor 160 is connected to the impurity regions of the semiconductor substrate 100 through the buried contact plug 140 and the buried contact pad among the contact pad 120. Upper electrodes 163 are provided on a dielectric layer 162, and the dielectric layer is provided on the lower electrodes 161 of the capacitor 160.

FIGS. 5A through 7A, and 5B through 7B are cross-sectional views illustrating methods for fabricating a semiconductor device having doped polycrystalline silicon-germanium layers according to embodiments of the present invention. FIGS. 5A through 7A are cross-sectional views cut in the bit line direction, and FIGS. 5B through 7B are cross-sectional views cut in the gate line direction.

Figure 5A:
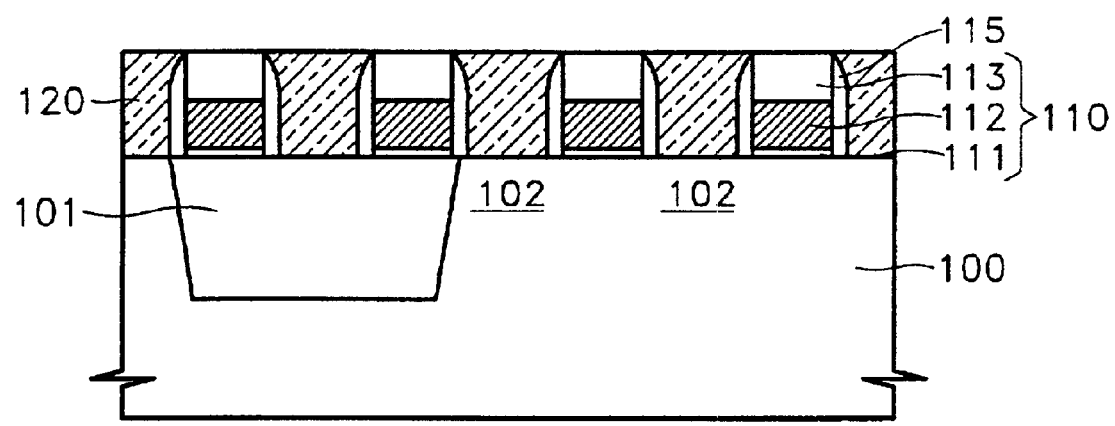
Figure 5B:
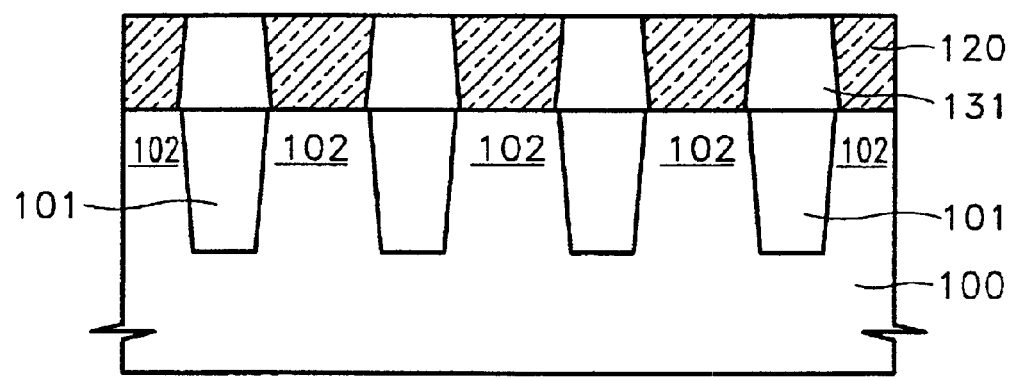

Now referring to FIGS. 5A and 5B, methods of fabricating a semiconductor device according to embodiments of the present invention will be discussed in detail. The isolation area 101 is formed within the semiconductor substrate 100 defining the active area 102. The isolation area 101 is illustrated as a recess in the Figures, but as will be understood by those having skill in the art, it can be also made using a general LOCOS method. A plurality of gate lines 110 are formed on the surface of the semiconductor substrate 100. The gate lines 110 are formed as stack structures in which the gate insulating layer 111, the gate conductive layer 112, and the gate capping layer 113 are sequentially deposited. An optional metal silicide layer (not shown) may be further formed between the gate conductive layer 112 and the gate capping layer 113 for reducing resistance. A plurality of gate spacers 115 are formed on the sidewalls of the gate lines 110. The gate insulating layer 111 is formed using a silicon oxide layer, the gate conductive layer 112 is formed from a polycrystalline silicon layer, and the gate capping layer 113 and the gate spacers 115 are formed from a silicon nitride layer. Although the gate insulating layer 111, the gate conductive layer 112, the gate capping layer 113 and the gate spacers 115 are described as being formed of particular materials, the present invention should not be limited to this configuration. It will be understood that any material that would provide the same functionality may be used.

Impurity regions (not shown) are formed in the active area 102 by injecting either n-type or p-type impurity ions. For example, if the transistor is a p-channel transistor, the impurity regions have a high concentration of p-type impurities. Alternatively, if the transistor is an n-channel transistor, the impurity regions have a high concentration of n-type impurities. Typically, an n-channel transistor is used in the cell area of DRAM. These impurity regions define the source and drain regions of the transistor.

A first electrically insulating layer 131 is formed to cover the gate lines 110 and the gate spacers 115 on the surface of the semiconductor substrate 100. The first electrically insulating layer 131 is formed from a material layer having a high etch selectivity with respect to the gate capping layer 113 and the gate spacers 115. For example, if the gate capping layer 113 and the gate spacers 115 are formed from silicon nitride layer, then the first electrically insulating layer 131 can be formed from a silicon oxide layer. A portion of the first electrically insulating layer 131 is removed to form contact holes that expose a portion of the semiconductor substrate 100 by using a predetermined mask layer pattern and a high etch selectivity with respect to the gate capping layer 113 and the gate spacers 115. A contact pad 120 is formed by depositing the doped polycrystalline silicon-germanium layer in the contact holes formed in the electrically insulating layer 131. The doped polycrystalline silicon-germanium layer may be formed by a chemical vapor deposition (CVD) method.

The conductivity type of the doped impurities within the contact pad 120 formed from the polycrystalline silicon-germanium layer is preferably the same as that of the majority carrier within the impurity regions of the semiconductor substrate 100. For example, the contact pad 120 connected to the impurity regions of the n-channel transistor is typically formed using the polycrystalline silicon-germanium layer doped with the n-type impurities. The n-type impurities may be, for example, phosphorous (P), arsenic (As), or antimony (Sb). As described above, since the polycrystalline silicon-germanium has a lower melting point than silicon, deposition, crystallization, growth of grains, and activation of impurities are typically performed at relatively low temperatures. The injected dopant is activated by annealing the implant. The annealing process includes a first annealing process performed at a temperature lower than about 750° C., and a rapid thermal process (RTP) performed at a temperature lower than about 900° C.

Figure 6A:
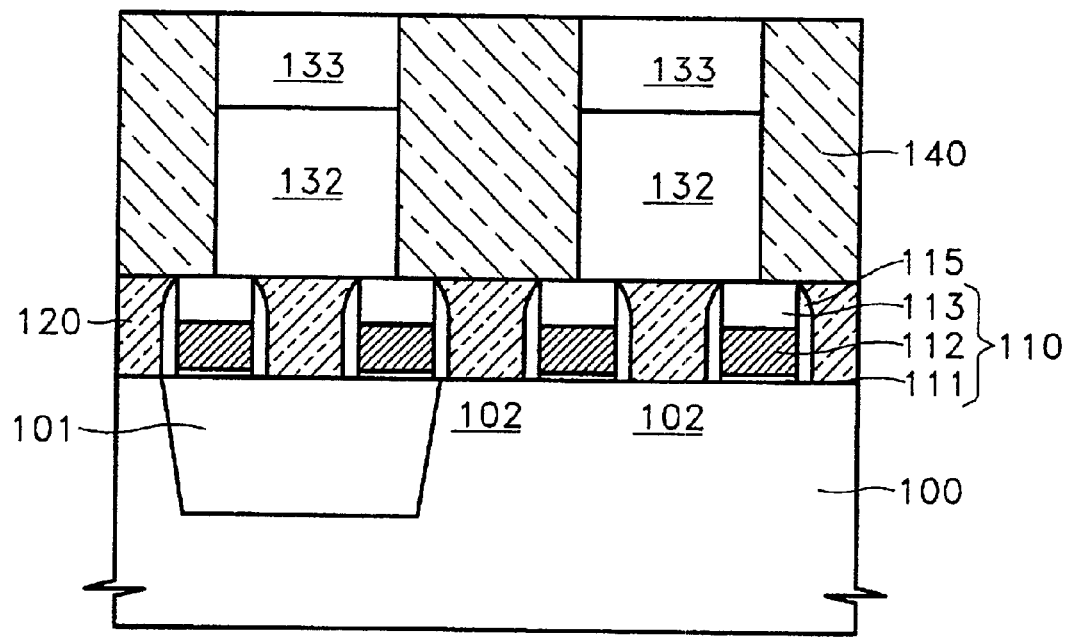
Figure 6B:
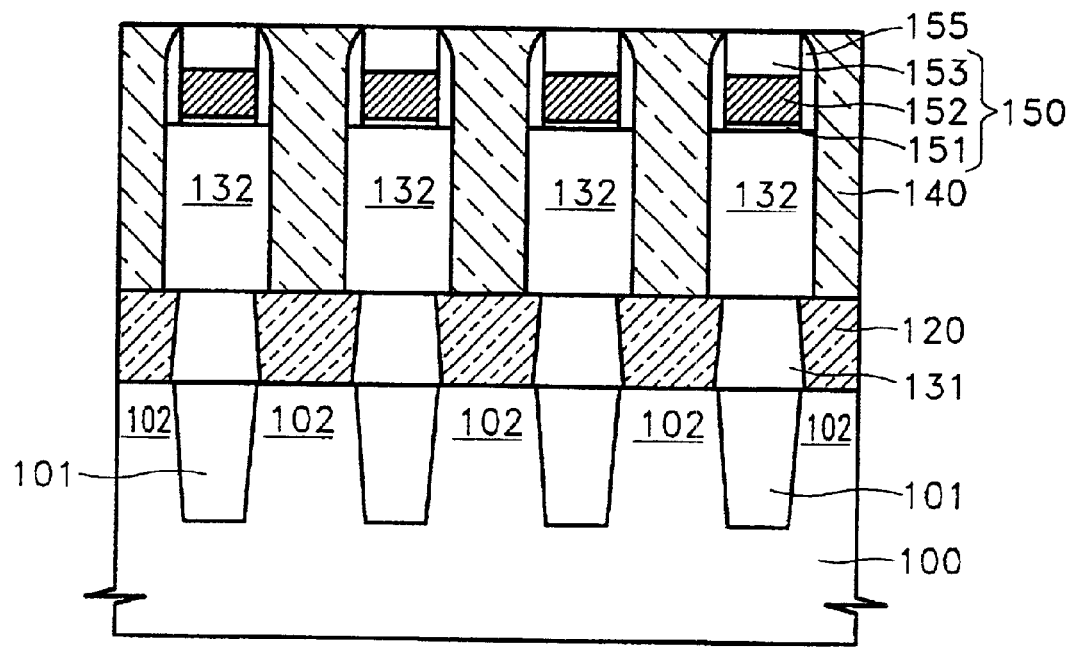

Now referring to FIGS. 6A and 6B, a second electrically insulating layer 132 is formed on the contact pad 120 and the first electrically insulating layer 131. A plurality of bit lines 150 are formed on the second electrically insulating layer 132 separated from each other. Each of the bit lines 150 is formed so that its lengthwise direction crosses that of the gate lines 110, and is formed as a stack structure in which the barrier metal layer 151, the bit line conductive layer 152, and the bit line capping layer 153 are sequentially deposited. An optional metal silicide layer (not shown) can be further formed between the bit line conductive layer 152 and the bit line capping layer 153 to reduce the resistance. The bit line spacers 115 are formed on the sidewalls of the bit lines 150. The barrier metal layer 151 is formed from a single layer or double layer of a titanium layer and a titanium nitride layer. The bit line conductive layer 152 is formed from a polycrystalline silicon-germanium layer and the bit line capping layer 153 and the bit line spacers 155 are formed from a silicon nitride layer. Although the layers are described as being formed of particular materials, the present invention should not be limited to these materials. It will be understood by those having skill in the art that other materials providing the same functionality could be substituted for the materials described above.

A third electrically insulating layer 133 is formed to cover a portion of the surface of the second electrically insulating layer 132, the bit lines 150 and the bit line spacers 155. The second electrically insulating layer 132 and the third electrically insulating layer 133 are formed from a material layer having a high etch selectivity with respect to the bit line capping layer 153 and the bit line spacers 155. For example, if the bit line capping layer 153 and the bit line spacers 155 are formed from a silicon nitride layer, then the second electrically insulating layer 132 and the third electrically insulating layer 133 can be formed from a silicon oxide layer. Portions of the second electrically insulating layer 132 and the third electrically insulating layer 133 are removed to form contact holes exposing a portion of the surface of the contact pad 120 by using a predetermined mask layer pattern and a high etch selectivity with respect to the bit line capping layer 153 and the bit line spacers 155. The contact pad 120 exposed here is the buried contact pad to be connected to the lower electrode of the capacitor. The buried contact plug 140, i.e. poly-$Si_{1-x}Ge_x$ conductive plug, is formed by depositing the doped polycrystalline silicon-germanium layer within the contact holes in the second and third electrically insulating layer 132 and 133. The doped polycrystalline silicon-germanium layer may be formed by the CVD method.

The conductivity type of the impurities doped within the buried contact plug 140 formed from the polycrystalline silicon-germanium layer is preferably the same as that for the majority carrier within the impurity regions of the semiconductor substrate 100. For example, the buried contact plug 140 connected to the contact pad 120 connected to the impurity regions of the n-channel transistor is formed using a doped polycrystalline silicon-germanium layer. The n-type impurities, for example, may be phosphorous (P), arsenic (As), or antimony (Sb). As described above, since the polycrystalline silicon-germanium has a lower melting point than silicon, deposition, crystallization, growth of grains, and activation of impurities are typically performed at relatively low temperatures. After the buried contact plug 140 is formed, the injected dopant is activated by annealing process. The annealing process includes a first annealing process performed at a temperature lower than 750° C., and an RTP performed at a temperature lower than 900° C.

Figure 7A:
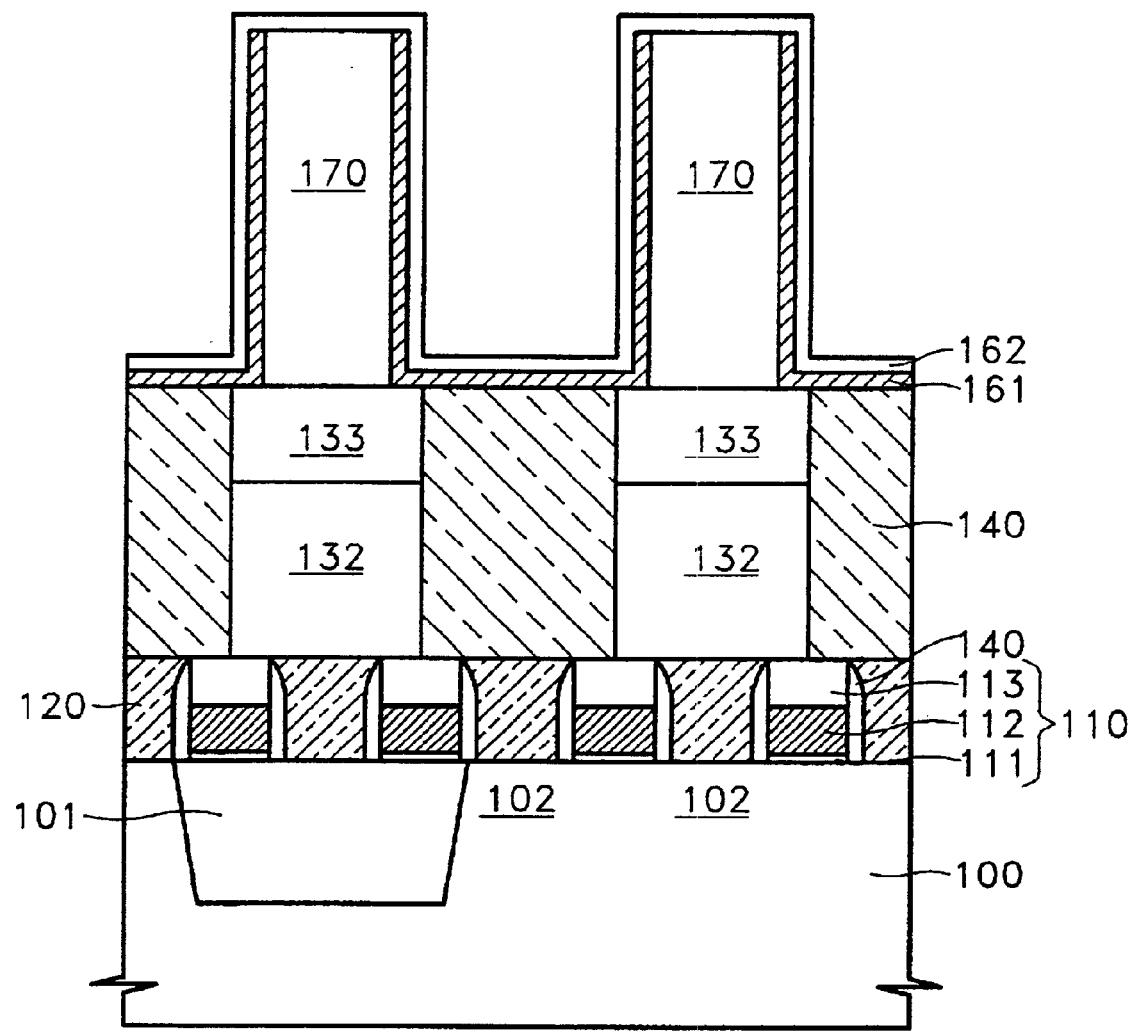
Figure 7B:
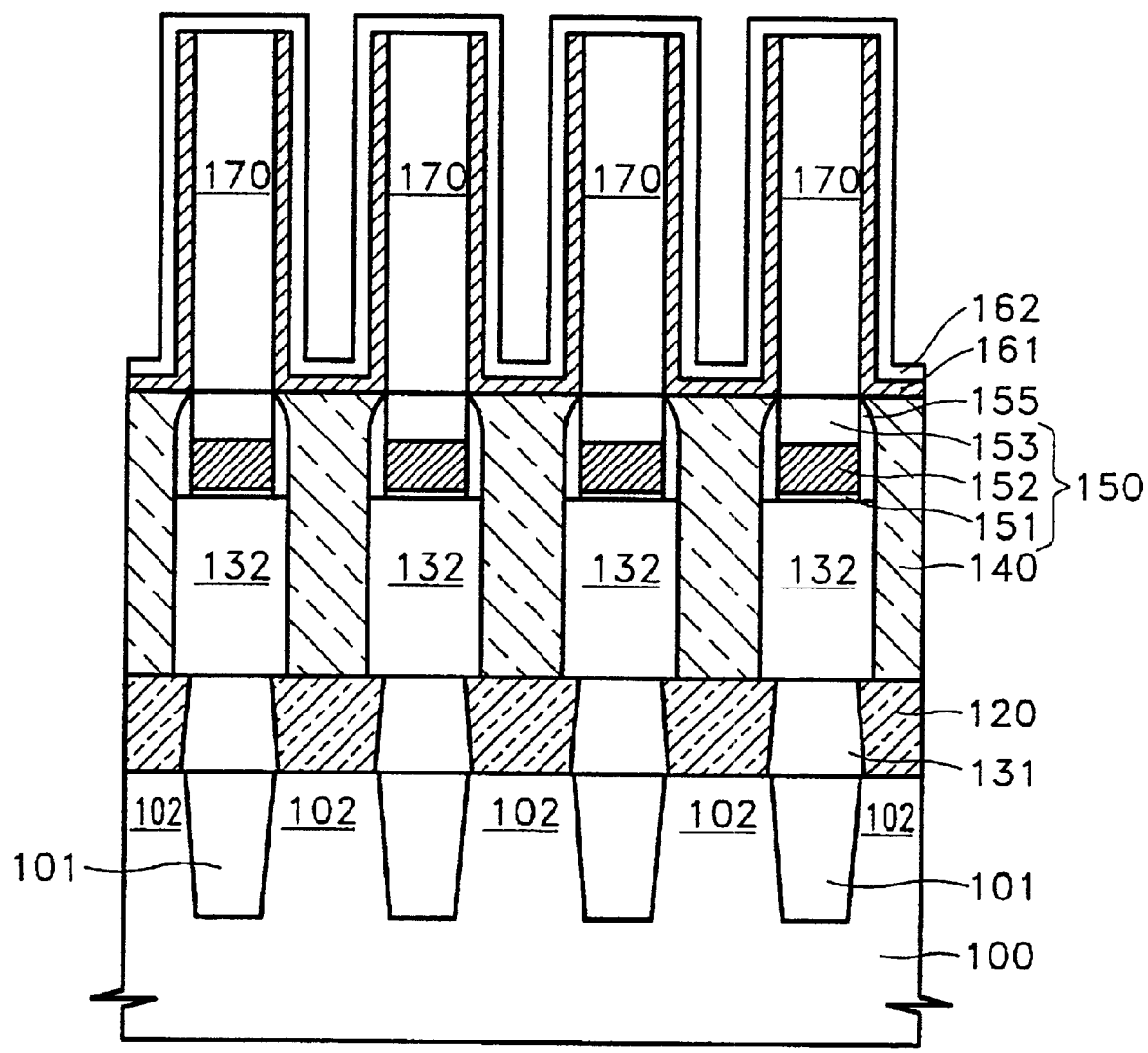

Referring to FIGS. 7A and 7B, an insulating layer 170 is formed on the whole surface of the structure of FIGS. 6A and 6B. The insulating layer 170 is patterned to form contact holes that expose the surface of the buried contact plug 140. A conductive layer is formed on the buried contact plug 140 and on the surface of the insulating layer 170. A plurality of capacitor lower electrodes 161 separated using a general node separation method are formed on the conductive layer. A dielectric layer 162 is then formed on the capacitor lower electrodes 161. Capacitor upper electrodes (163 of FIGS. 1 and 2) are formed on the dielectric layer 162.

Figure 8:
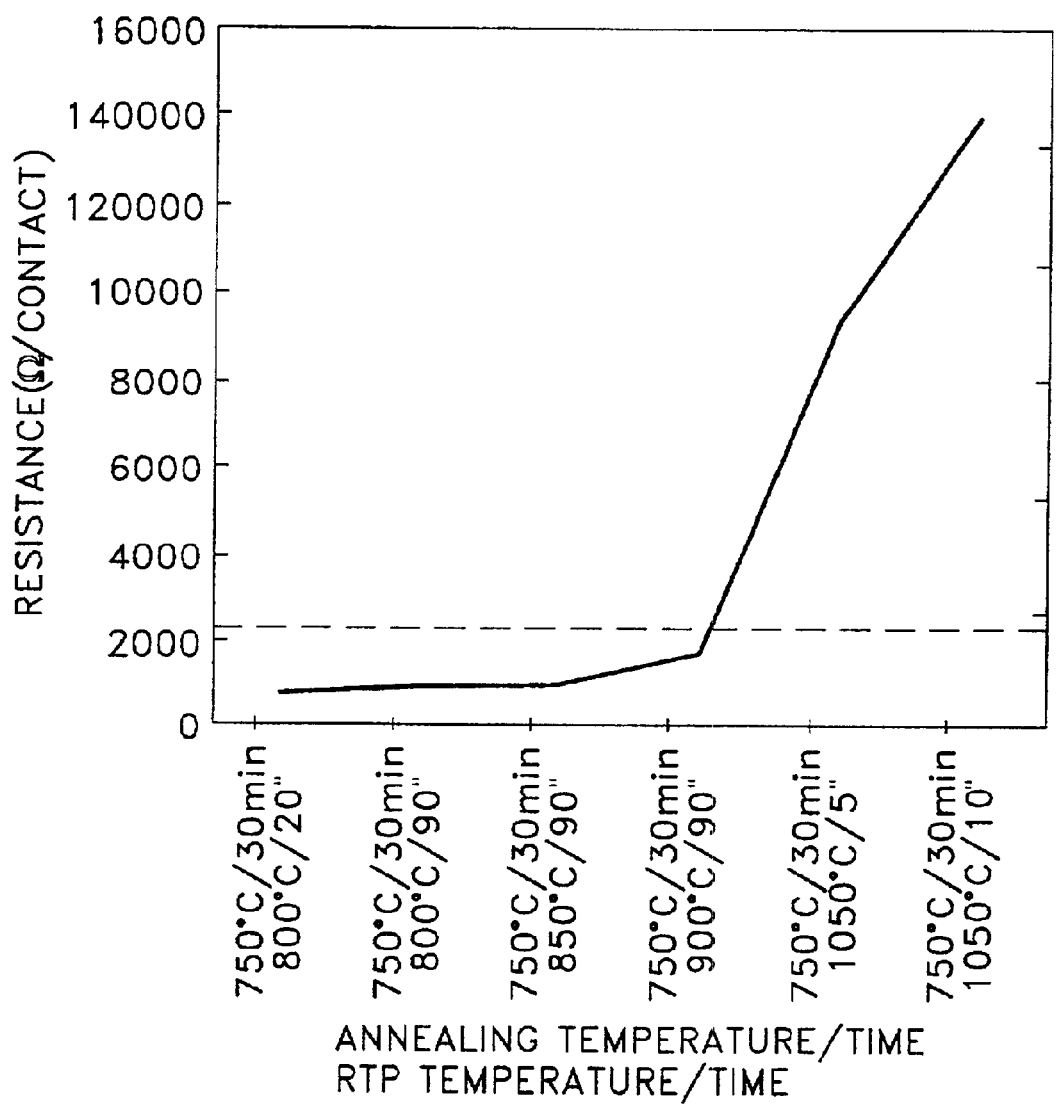
FIG. 8 is a graph illustrating the resistance between a metal stud and a $p^+$ type impurity region in a peripheral circuit area with respect to annealing temperature and time after forming doped polycrystalline silicon-germanium layers according to embodiments of the present invention.

Now referring to FIG. 8, a graph illustrating the resistance between a metal stud and $p^+$ type impurity regions in a peripheral circuit area with respect to annealing temperature and time after forming a doped polycrystalline silicon-germanium layer will be discussed in detail. As used herein, "$n^+$" or "$p^+$" refer to regions that are defined by higher carrier concentrations than are present in adjacent or other regions of the same or another layer or substrate. As shown in FIG. 8, as a result of measuring a change in resistance between the metal stud and the $p^+$ type impurity regions in the peripheral circuit area with respect to annealing temperature and time after forming the doped polycrystalline silicon-germanium layer, and as a result of a first annealing process at a temperature lower than about 750° C. for about 30 minutes after forming the doped polycrystalline silicon-germanium layer and the RTP at a temperature lower than about 900° C. for about 90 seconds, a desired resistance lower than about 2200 Ω/contact is obtained.

Figure 9:
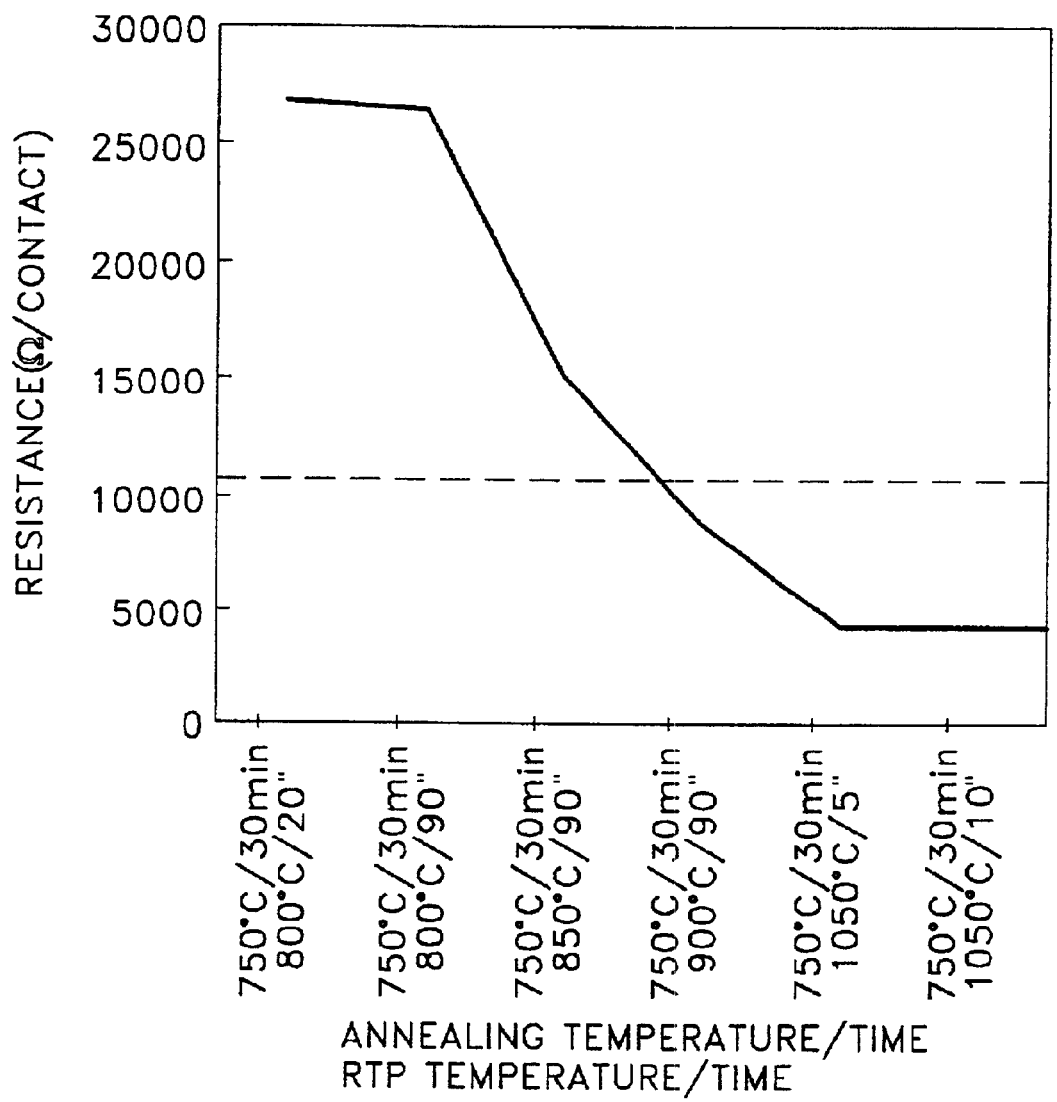
FIG. 9 is a graph illustrating resistance between a contact pad and an n type impurity region in a cell area with respect to annealing temperature and time after forming doped polycrystalline silicon-geranium layers according to embodiments of the present invention.

Now referring to FIG. 9, a graph illustrating the resistance between the contact pad and the n-type impurity regions in the cell area with respect to annealing temperature and time after forming the doped polycrystalline silicon-germanium will be discussed. As shown in FIG. 9, as a result of measuring a change in resistance per contact between the contact pad and the n-type impurity regions in the cell area with respect to annealing temperature and time after forming the contact pad of the doped polycrystalline silicon-germanium layer, and as a result of the first annealing process at a temperature lower than about 750° C. for about 30 minutes after forming the contact pad of the doped polycrystalline silicon-germanium layer and the RTP at a temperature lower than about 900° C. for about 90 seconds, a desired resistance lower than about 5800 Ω/contact may be obtained.

As described above, a semiconductor device is provided having doped polycrystalline silicon-germanium layers and a contact pad in contact with the impurity regions of the semiconductor substrate. A buried contact plug connecting the contact pad to the capacitor lower electrodes are formed using the polycrystalline silicon-germanium layer doped with the n-type impurities, so that the activation of a dopant can be performed at a relatively low temperature. Thus, it is possible to prevent property deterioration such as an increase in resistance in other parts of the device susceptible to heat budge, for example, increase in resistance between the metal stud and the p+ type impurity regions in the peripheral circuit area.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
    a semiconductor substrate having a semiconductor region of first conductivity type therein extending adjacent a surface thereof;
    an electrically insulating layer having a contact hole therein that exposes the semiconductor region of first conductivity type, on the surface of said semiconductor substrate; and
    a poly-$Si_{1-x}Ge_x$ conductive plug of first conductivity type that extends in the contact hole and is electrically connected to the semiconductor region of first conductivity type, wherein a germanium mole fraction x within the poly-$Si_{1-x}Ge_x$ conductive plug is in a range between about 0.25 and about 0.35.

2. An integrated circuit memory device, comprising:
    a semiconductor substrate;
    a memory cell access transistor adjacent a surface of said semiconductor substrate, said memory cell access transistor comprising a word line on the surface and source and drain regions of first conductivity type in said semiconductor substrate;
    a first interlayer insulating layer on said semiconductor substrate, said first interlayer insulating layer having a first opening therein that extends opposite the source region;
    a first poly-$Si_{1-x}Ge_x$ conductive plug of first conductivity type that extends in the first opening and directly contacts the source region;
    an integrated circuit capacitor that extends on said semiconductor substrate and has an electrode electrically connected to said first poly-$Si_{1-x}Ge_x$ conductive plug;
    a second interlayer insulating layer on said first interlayer insulating layer, said second interlayer insulating layer having a second opening therein that extends opposite said first poly-$Si_{1-x}Ge_x$ conductive plug; and
    a second poly-$Si_{1-x}Ge_x$ conductive plug of the first conductivity type that extends in the second opening and is electrically connected to said poly-$Si_{1-x}Ge_x$ conductive plug, wherein a germanium mole fraction x within said second poly-$Si_{1-x}Ge_x$ conductive plug is unequal to the germanium mole fraction x within said first poly-$Si_{1-x}Ge_x$ conductive plug.

3. The device of claim 2, wherein the integrated circuit capacitor that extends on said second interlayer insulating layer and has a lower electrode electrically connected to said second poly-$Si_{1-x}Ge_x$ conductive plug.

4. The device of claim 3, wherein the lower electrode directly contacts said second poly-$Si_{1-x}Ge_x$ conductive plug.

5. An integrated circuit device, comprising:
    a semiconductor substrate;
    an electrically insulating layer on said semiconductor substrate, said electrically insulating layer having a contact hole therein; and
    a poly-$Si_{1-x}Ge_x$ conductive plug of first conductivity type that extends in the contact hole, wherein a germanium mole fraction x within the poly-$Si_{1-x}Ge_x$ conductive plug is in a range between about 0.25 and about 0.35.

* * * * *